(12) United States Patent
Liu et al.

(10) Patent No.: US 12,720,914 B2
(45) Date of Patent: Aug. 25, 2026

(54) MULTI-QUANTUM WELL SEMICONDUCTOR STRUCTURE INCLUDING A SCANDIUM NITRIDE INSERTION LAYER

(71) Applicant: ENKRIS SEMICONDUCTOR, INC., Suzhou (CN)

(72) Inventors: Weihua Liu, Suzhou (CN); Liangfang Sun, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 537 days.

(21) Appl. No.: 18/357,433

(22) Filed: Jul. 24, 2023

(65) Prior Publication Data

US 2024/0170607 A1 May 23, 2024

(30) Foreign Application Priority Data

Nov. 23, 2022 (CN) ........................ 202211477432.2

(51) Int. Cl.
*H10H 20/812* (2025.01)
*H10H 20/822* (2025.01)

(52) U.S. Cl.
CPC ........ *H10H 20/812* (2025.01); *H10H 20/822* (2025.01)

(58) Field of Classification Search
CPC .. H10H 20/812; H10H 20/822; H10H 20/825; H10H 20/815; H10H 20/8215; H10H 20/8252; H10H 20/81; H10H 20/8131
See application file for complete search history.

(56) References Cited

FOREIGN PATENT DOCUMENTS

CN 114975704 A * 8/2022 ......... H10H 20/8252

* cited by examiner

*Primary Examiner* — John P. Dulka
(74) *Attorney, Agent, or Firm* — Westbridge IP LLC

(57) ABSTRACT

A semiconductor structure includes: a first semiconductor layer, a multiple quantum well layers formed on the first semiconductor layer, where the multiple quantum well layer includes a plurality of quantum barrier layers and a plurality of quantum well layers alternately arranged; an insertion layer formed on each of the plurality of quantum well layers; and a second semiconductor layer formed on the multiple quantum well layer; where a material of the insertion layer is a nitride containing a scandium component. In this application, the insertion layer, made of the nitride containing the scandium component, may repair deterioration problem of epitaxial quantum well materials. Moreover, a compressive stress on the quantum well layer located below is introduced, to achieve longer light-emitting wavelengths by using InGaN quantum well materials with a lower content of In component.

16 Claims, 4 Drawing Sheets

MULTI-QUANTUM WELL SEMICONDUCTOR STRUCTURE INCLUDING A SCANDIUM NITRIDE INSERTION LAYER

CROSS-REFERENCE TO RELATED APPLICATIONS

The application claims priority to Chinese Patent Application No. 202211477432.2, filed on Nov. 23, 2022, which is hereby incorporated by reference in its entirety.

TECHNICAL FIELD

The present application relates to the field of semiconductor technologies, and in particular, to a semiconductor structure.

BACKGROUND

GaN materials are usually used to prepare a GaN-based Light Emitting Diode (LED) through a Metal Organic Chemical Vapor Deposition (MOCVD) method in lighting, display and other fields. A luminescent region of the GaN-based LED is mainly a Multiple Quantum Well (MQW) structure periodically composed of GaN and InGaN materials, where a material of quantum well is InGaN. MQW growth of InGaN/GaN with high quality and high component of In is a key issue in achieving long wavelength light-emitting devices. However, a high In content in InGaN quantum well layers is difficult to achieve.

SUMMARY

In view of this, a semiconductor structure is provided by embodiments of the present application to solve a technical problem of difficulty in achieving high component of In in an InGaN quantum well layer.

According to an aspect of the present application, a semiconductor structure is provided by an embodiment of the present application, including: a first semiconductor layer; a multiple quantum well layer formed on the first semiconductor layer, where the multiple quantum well layer includes a plurality of quantum barrier layers and a plurality of quantum well layers alternately arranged; an insertion layer formed on each of the plurality of quantum well layers; and a second semiconductor layer formed on the multiple quantum well layer; where a material of the insertion layer is a nitride containing a scandium component.

As an optional embodiment, the material of the insertion layer includes one or more combinations of $Sc_xGa_{1-x}N$, $Sc_xAl_yGa_{1-x-y}N$, $Sc_xIn_yGa_{1-x-y}N$, or $Sc_xAl_yIn_zGa_{1-x-y-z}N$.

As an optional embodiment, a content of the scandium component x in the insertion layer is greater than or equal to 0.01 and less than or equal to 0.5.

As an optional embodiment, the semiconductor structure includes a plurality of insertion layers, and in a direction from the first semiconductor layer to the multiple quantum well layer, a content change of the scandium component of each of the plurality of insertion layers includes one or more combinations of uniform invariance, linear increasing, linear decreasing, stepped increasing, stepped decreasing, and delta changing.

As an optional embodiment, the semiconductor structure includes a plurality of insertion layers, and a thickness of each of the plurality of insertion layers is greater than or equal to 0.5 nm and less than or equal to 5 nm.

As an optional embodiment, a doping type of the insertion layer is n-type doping or p-type doping.

As an optional embodiment, the semiconductor structure includes a plurality of insertion layers, and in a direction from the first semiconductor layer to the multiple quantum well layer, contents of the scandium component x in the plurality of insertion layers increase uniformly or jumps layer by layer.

As an optional embodiment, in a direction from the first semiconductor layer to the multiple quantum well layer, the insertion layer is a multi-layer structure.

As an optional embodiment, materials of the multi-layer structure are the same and include one of $Sc_xGa_{1-x}N$, $Sc_xAl_yGa_{1-x-y}N$, $Sc_xIn_yGa_{1-x-y}N$, or $Sc_xAl_yIn_zGa_{1-x-y-z}N$.

As an optional embodiment, the multi-layer structure includes a first scandium component layer and a second scandium component layer away from the quantum well layer stacked in layers.

As an optional embodiment, a content of the scandium component x in the first scandium component layer is greater than a content of the scandium component x in the second scandium component layer.

As an optional embodiment, materials of the multi-layer structure are different, and include a combination of multiple sequential structures or periodic structures of $Sc_xGa_{1-x}N$, $Sc_xAl_yGa_{1-x-y}N$, $Sc_xIn_yGa_{1-x-y}N$, or $Sc_xAl_yIn_zGa_{1-x-y-z}N$.

As an optional embodiment, a content of the scandium component x in the multi-layer structure is the same or different.

As an optional embodiment, the insertion layer has a plurality of sub-regions in a horizontal direction.

As an optional embodiment, contents of the scandium component x in at least two sub-regions of the plurality of sub-regions are different.

As an optional embodiment, the quantum well layer is an InGaN quantum well layer, and the quantum barrier layer is a GaN quantum barrier layer.

As an optional embodiment, the first semiconductor layer is an n-type layer, the second semiconductor layer is a p-type layer, and materials of the first semiconductor layer and the second semiconductor layer are GaN-based materials.

DETAILED DESCRIPTION OF THE EMBODIMENTS

Figure 1:
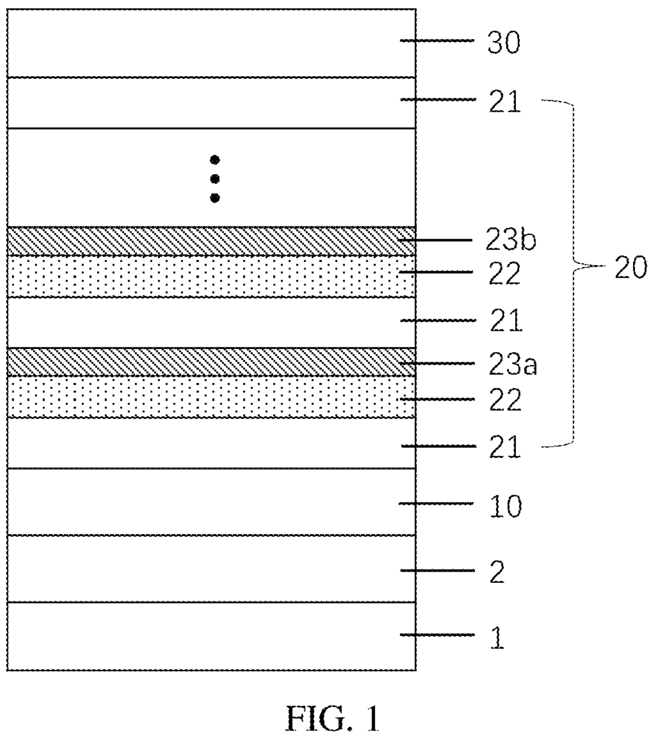
FIG. 1 is a schematic diagram of a semiconductor structure according to an embodiment of the present application.

The technical schemes in the embodiments of the present disclosure will be described clearly and completely below in combination with the accompanying drawings in the embodiments of the present disclosure. Obviously, the described embodiments are only a part of the embodiments of the present disclosure, not all of the embodiments. Based on the embodiments in the present disclosure, all other embodiments obtained by those skilled in the art without creative efforts shall fall within the protection scope of the present disclosure.

Due to a difference in optimal growth temperatures of InGaN and GaN materials, if a GaN quantum barrier layer is grown at a low temperature, although it is beneficial for growth of a InGaN quantum well layer, crystal quality of the quantum barrier layer may decrease, thereby reducing luminous efficiency.

Currently, the GaN quantum barrier layer is usually grown at a higher temperature. However, this may cause decomposition of the InGaN quantum well layer during a heating process. On the one hand, crystal quality of the quantum well material may decrease, resulting in a significant decrease in internal quantum efficiency of a LED and a larger half width of a characteristic luminescence spectrum. On the other hand, a content of In component in the quantum well layer may decrease, causing the light-emitting wavelength of the light-emitting device to be shorter. Thus, an increasing demand for the content of the In component in InGaN materials may not be satisfied, that is, manufacturing of a long wavelength light-emitting device may not be achieved.

In order to solve a technical problem of difficulty in achieving high component of In in an InGaN quantum well layer, a semiconductor structure is provided in the present application, including: a first semiconductor layer; a multiple quantum well layer formed by a plurality of quantum barrier layers and a plurality of quantum well layers alternately arranged; an insertion layer, disposed on each of the plurality of quantum well layers, where a material of the insertion layer is a nitride containing a scandium component; and a second semiconductor layer. The insertion layer above an InGaN quantum well layer of the multiple quantum well layer in the semiconductor structure of the present application is made of a nitride containing a scandium component, and a Sc atom is used to replace a Ga atom in a GaN insertion layer. Due to a larger cell size of Sc—N compared to Ga—N, a tensile stress of the insertion layer doped with Sc elements based on the InGaN quantum well layer may be alleviated and released, improving material quality of the insertion layer containing the Sc element, reducing defect density of the insertion layer, and providing the quantum well layer with a better protection, that is, avoiding precipitation of In from an InGaN quantum well while repairing deterioration of epitaxial quantum well materials. Moreover, the GaN insertion layer containing the scandium component may introduce a compressive stress to the InGaN quantum well layer located below, so that a band gap of the quantum well layer bends smaller due to stress, thereby realizing a longer light-emitting wavelength with the InGaN quantum well material with a lower component of In.

The semiconductor structure mentioned in the present application is further illustrated with reference to FIG. 1 to FIG. 5.

FIG. 1 is a schematic diagram of a semiconductor structure according to an embodiment of the present application.

As shown in FIG. 1, a semiconductor structure includes a first semiconductor layer 10, a multiple quantum well layer 20 formed on the first semiconductor layer 10, where the multiple quantum well layer 20 includes a plurality of quantum barrier layers 21 and a plurality of quantum well layers 22 alternately arranged, an insertion layer 23 formed on each of the plurality of quantum well layers 22, and a second semiconductor layer 30 formed on the multiple quantum well layer 20. A material of the insertion layer 23 is a nitride containing a scandium component.

In this embodiment, the semiconductor structure further includes a substrate 1. A material of the substrate 1 includes one or more combinations of Si, $Al_2O_3$, GaN, SiC, or AlN. In order to alleviate stress in an epitaxial structure above the substrate 1 and avoid cracking of the epitaxial structure, the semiconductor structure may further include a buffer layer 2 prepared above the substrate 1. A material of the buffer layer 2 may include one or more of GaN, AlGaN, AlInGaN, and is not limited to this.

In this embodiment, materials of the first semiconductor layer 10 and the second semiconductor layer 30 are GaN-based materials, and the materials of the first semiconductor layer 10 and the second semiconductor layer 30 may be the same or different. The first semiconductor layer 10 is an n-type layer, and an n-type doping ion may include at least one of a Si ion, a Ge ion, a Sn ion, a Se ion, or a Te ion. The second semiconductor layer 30 is a p-type layer, and a p-type doping ion may include at least one of a Mg ion, a Zn ion, a Ca ion, a Sr ion, or a Ba ion. The first semiconductor layer 10 and the second semiconductor layer 30 may be grown through in situ growth, or may be obtained through atomic layer deposition (ALD), or chemical vapor deposition (CVD), or molecular beam epitaxy (MBE), or plasma enhanced chemical vapor deposition (PECVD), or low-pressure chemical vapor deposition (LPCVD), or metal organic chemical vapor deposition (MOCVD), or a combination thereof.

In this embodiment, a band gap width of the quantum barrier layer 21 is greater than a band gap width of the quantum well layer 22. For example, a material of the quantum barrier layer 21 is GaN, and a material of quantum well layer 22 is InGaN. Optionally, a material of the insertion layer 23 includes one or more combinations of $Sc_xGa_{1-x}N$, $Sc_xAl_yGa_{1-x-y}N$, $Sc_xIn_yGa_{1-x-y}N$, or $Sc_xAl_yIn_zGa_{1-x-y-z}N$.

In this embodiment, a content of the scandium component x in the insertion layer 23 is greater than or equal to 0.01 and less than or equal to 0.5. The semiconductor structure includes a plurality of insertion layers 23. In a direction from the first semiconductor layer 10 to the multiple quantum well layer 20, a content change of the scandium component of each of the plurality of insertion layers 23 includes one or more combinations of uniform invariance, linear increasing, linear decreasing, stepped increasing, stepped decreasing, and delta changing. A growth method of the delta changing is to disconnect three family sources (such as gallium and aluminum sources) while introducing scandium source, so that scandium atoms exhibit a delta-function-like distribution inside the material. This growth method of modulating an energy band by performing doping within a limited area of an epitaxial layer may reduce ionization energy.

In this embodiment, the insertion layer 23 may be n-type doping or p-type doping. When the insertion layer 23 is n-type doping, such as silicon-doped or germanium-doped, it is beneficial to reduce an electrical barrier formed by a higher conduction band introduced by the insertion layer 23, thereby improving longitudinal conductivity and reducing a forward working voltage of the LED. When the insertion layer is p-type doping, such as magnesium-doped or zinc-doped, a quantity of holes may be effectively increased, which is beneficial for improving internal quantum efficiency of a light-emitting diode, ultimately improving luminous efficiency and light efficacy of the light-emitting diode.

In this embodiment, a thickness of the insertion layer 23 is greater than or equal to 0.5 nm and less than or equal to 5 nm. A thickness of the insertion layer 23 can also be greater than or equal to 1 nm and less than or equal to 2 nm. In order to introduce compressive stress on the quantum well layer 22, it is necessary to grow a nitride film exceeding a critical thickness to release a tensile stress brought about by the quantum well layer 22.

Specifically, when the material of the insertion layer 23 is GaN material, a Sc element is introduced and a Sc atom is used to replace a Ga atom in the insertion layer 23 of which the material includes GaN. Due to a larger cell size of Sc—N compared to Ga—N, a tensile stress of the insertion layer 23 doped with the Sc element based on InGaN quantum well layer 22 may be relieved and released, improving material quality of the insertion layer 23 containing the Sc element, reducing defect density of the insertion layer 23, and providing the quantum well layer 22 with a better protection, that is, avoiding precipitation of In from the InGaN quantum well layer 22 while repairing deterioration of epitaxial quantum well materials. Moreover, the GaN insertion layer 23 containing the scandium component may introduce a compressive stress to the InGaN quantum well layer 22 located below, so that a band gap of the quantum well layer 22 bends smaller due to stress, thereby realizing a longer light-emitting wavelength with the InGaN quantum well material with a lower component of In.

Figure 2A:
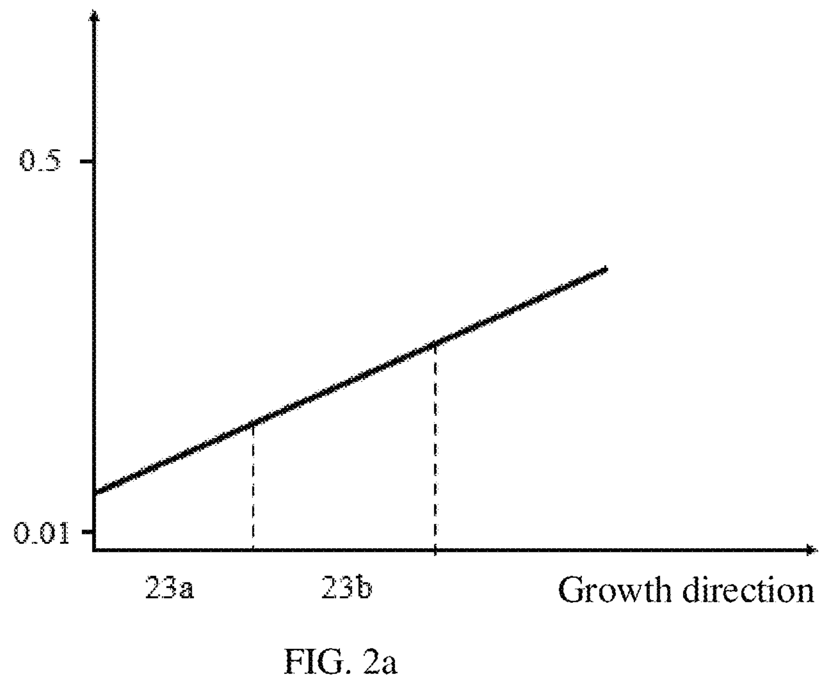
FIG. 2*a* and FIG. 2*b* are schematic diagrams of two changes in contents of scandium component in a plurality of insertion layers in a semiconductor structure according to another embodiment of the present application respectively.
Figure 2B:
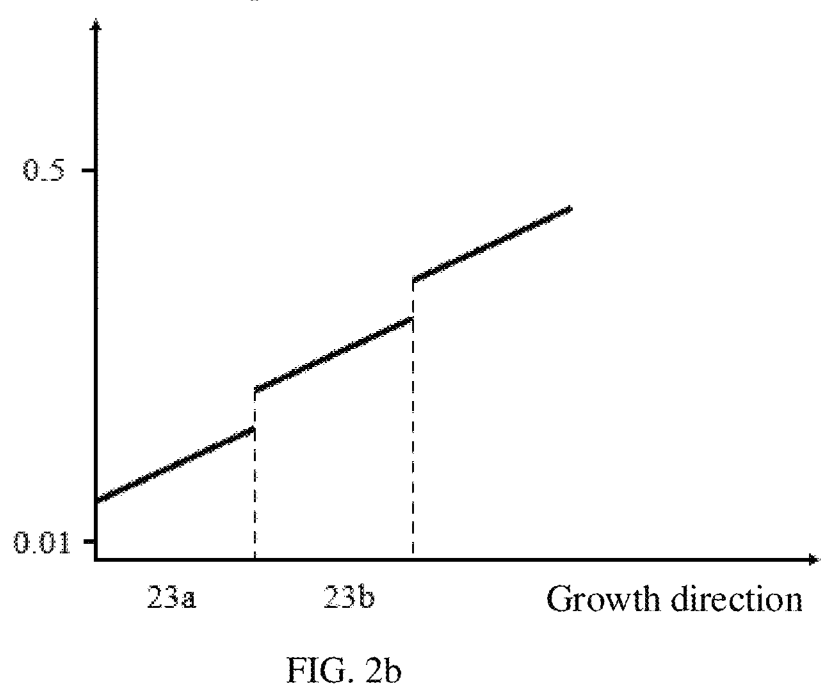

FIG. 2*a* and FIG. 2*b* are schematic diagrams of two changes in the contents of scandium component in the plurality of insertion layers in a semiconductor structure according to another embodiment of this application, respectively.

As shown in FIG. 2, a difference between the semiconductor structure of the embodiment and embodiments described above is that in the direction from the first semiconductor layer 10 to the multiple quantum well layer 20, contents of scandium component x in a plurality of insertion layers 23*a*, 23*b*, . . . increase uniformly layer by layer (FIG. 2*a*) or jumps layer by layer (FIG. 2*b*). The contents of scandium component x in the plurality of insertion layers 23*a*, 23*b*, . . . gradually increase, improving film quality of insertion layers subsequently grown, changing surface morphology of the material, improving surface mobility of In atoms, improving optical quality, and thus improving the luminous efficiency of the LED.

In addition to the differences described above, other structures of the semiconductor structure in this embodiment may be referred to the corresponding structures of the semiconductor structure in embodiments described above.

Figure 3:
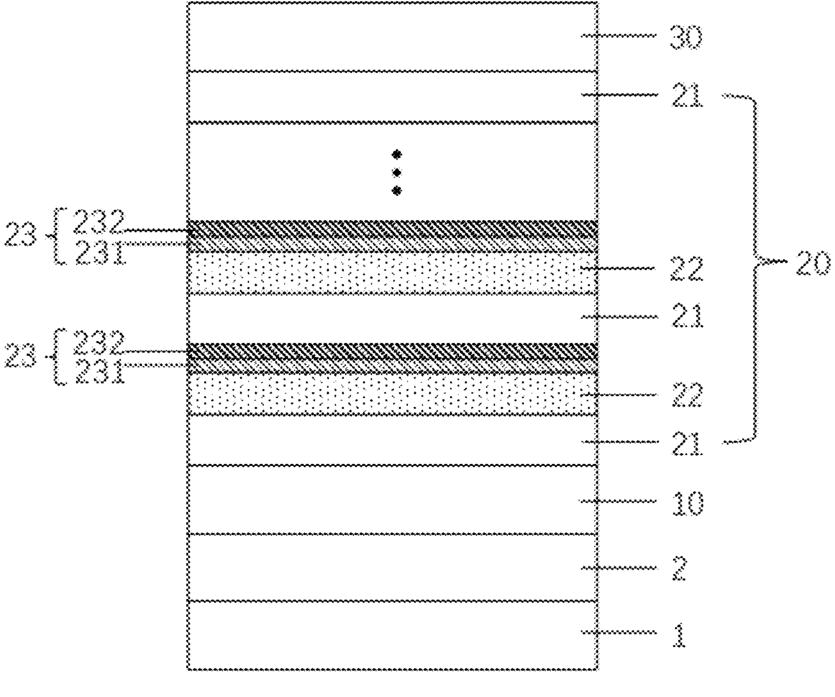
FIG. 3 is a schematic diagram of a semiconductor structure according to another embodiment of the present application.

FIG. 3 is a schematic diagram of a semiconductor structure according to another embodiment of the present application.

As shown in FIG. 3, a difference between the semiconductor structure of this embodiment and semiconductor structures described in above embodiments is that the insertion layer 23 is a multi-layer structure in a direction from the first semiconductor layer 10 to the multiple quantum well layer 20. The insertion layer 23 includes a first scandium component layer 231 and a second scandium component layer 232 away from the quantum well layer 22 stacked in layers. A material of the first scandium component layer 231 and a material of the second scandium component layer 232 are the same and include any one of $Sc_xGa_{1-x}N$, $Sc_xAl_yGa_{1-x-y}N$, $Sc_xIn_yGa_{1-x-y}N$, or $Sc_xAl_yIn_zGa_{1-x-y-z}N$. A content of the scandium component x in the first scandium component layer 231 is greater than a content of the scandium component x in the second scandium component layer 232. The content of scandium component x in the first scandium layer 231 is relatively high, which may provide the quantum well layer 22 with a better protection and avoid In precipitation from the InGaN quantum well; and the content of scandium component x in the second scandium layer 232 away from the quantum well layer 22 decreases, so that a lattice constant difference between the second scandium layer 232 and the quantum barrier layer 21 located above decreases, ensuring crystal growth quality of the quantum barrier layer 21 located above. A stepwise heating method is adopted to grow the first scandium component layer 231 and the second scandium component layer 232 of the insertion layer 23, so that the In component of the quantum well layer 22 may be better protected to reduce occurrence of In precipitation during subsequent epitaxy of the quantum barrier layer 21. Thus, the growth temperature of the quantum barrier layer 21 may be higher, thereby improving the crystal quality of the multiple quantum well layer 20 and effectively increasing the internal quantum efficiency of the light-emitting diode.

In addition to the differences described above, other structures of the semiconductor structure in this embodiment may be referred to the corresponding structures of the semiconductor structure in embodiments described above.

Figure 4:
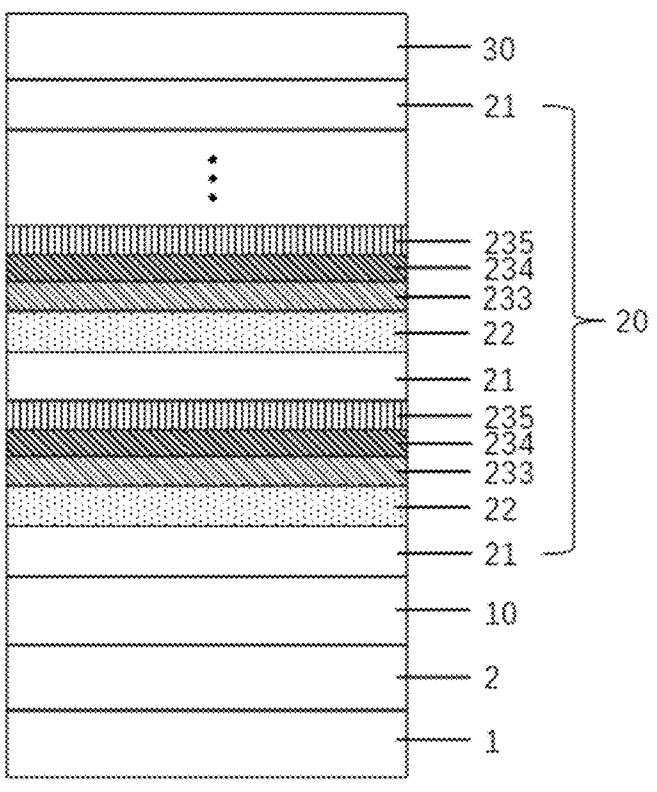
FIG. 4 is a schematic diagram of a semiconductor structure according to another embodiment of the present application.

FIG. 4 is a schematic diagram of a semiconductor structure according to another embodiment of the present application.

As shown in FIG. 4, a difference between a semiconductor structure of this embodiment and semiconductor structures described in above embodiments is that an insertion layer 23 is a multi-layer structure in a direction from the first semiconductor layer 10 to the multiple quantum well layer 20. Contents of the scandium component x in the multi-layer structure are the same or different. Materials of the multi-layer structure are different and include a combination of multiple sequential structures or periodic structures of $Sc_xGa_{1-x}N$, $Sc_xAl_yGa_{1-x-y}N$, $Sc_xIn_yGa_{1-x-y}N$, or $Sc_xAl_yIn_zGa_{1-x-y-z}N$. A multi-layer insertion layer structure may ensure that when the entire epitaxial layer grows under high temperature conditions, cracking effect caused by temperature changes may be avoided, and when compressive stress is introduced, the crystal quality may not decrease.

In this embodiment, the insertion layer 23 may be a three-layer structure. In an epitaxial direction of the semiconductor structure, the three-layer structure includes a thinner gallium nitride layer 233, a scandium-rich aluminum gallium nitride layer 234, and a gallium nitride layer 235. The thinner gallium nitride layer 233 is used to protect a quantum well layer 22 below the insertion layer 23 and the scandium-rich aluminum gallium nitride layer 234. The scandium-rich aluminum gallium nitride layer 234 is an aluminum gallium nitride layer where scandium component is rich or a pure aluminum nitride layer, used to introduce compressive stress in the quantum well layer 22. The third layer is also a gallium nitride layer 235 containing scandium, but a content of the scandium component therein is lower than that of the scandium-rich aluminum gallium nitride layer 234, so that a difference in a lattice constant between the gallium nitride layer 235 and the quantum barrier layer 21 located above is reduced, ensuring crystal growth quality of the quantum barrier layer 21 located above.

In addition to the differences described above, other structures of the semiconductor structure in this embodiment may be referred to the corresponding structures of the semiconductor structure in embodiments described above.

Figure 5:
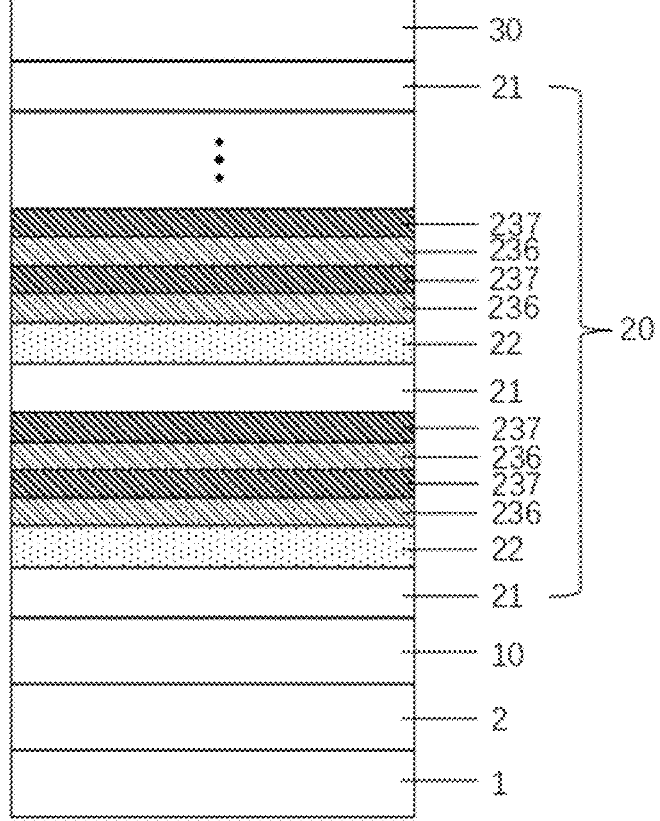
FIG. 5 is a schematic diagram of a semiconductor structure according to another embodiment of the present application.

FIG. 5 is a schematic diagram of a semiconductor structure according to another embodiment of the present application.

As shown in FIG. 5, a difference between the semiconductor structure of this embodiment and semiconductor structures described in above embodiments is that an insertion layer 23 is a multi-layer structure in a direction from the first semiconductor layer 10 to the multiple quantum well layer 20. Contents of the scandium component x in the multi-layer structure are the same or different. Materials of the multi-layer structure are different and include a combination of multiple periodic structures of $Sc_xGa_{1-x}N$, $Sc_xAl_yGa_{1-x-y}N$, $Sc_xIn_yGa_{1-x-y}N$, or $Sc_xAl_yIn_zGa_{1-x-y-z}N$. A multi-layer insertion layer structure may ensure that when the entire epitaxial layer grows under high temperature conditions, cracking effect caused by temperature changes may be avoided, and when compressive stress is introduced, the crystal quality may not decrease.

In this embodiment, the insertion layer 23 may be a periodic structure, for example, a periodic structure of the insertion layer 23 consists of a low-scandium-content gallium nitride layer 236 and a high-scandium-content aluminum gallium nitride layer 237 repeating multiple cycles.

In addition to the differences described above, other structures of the semiconductor structure in this embodiment may be referred to the corresponding structures of the semiconductor structure in embodiments described above.

Figure 6:
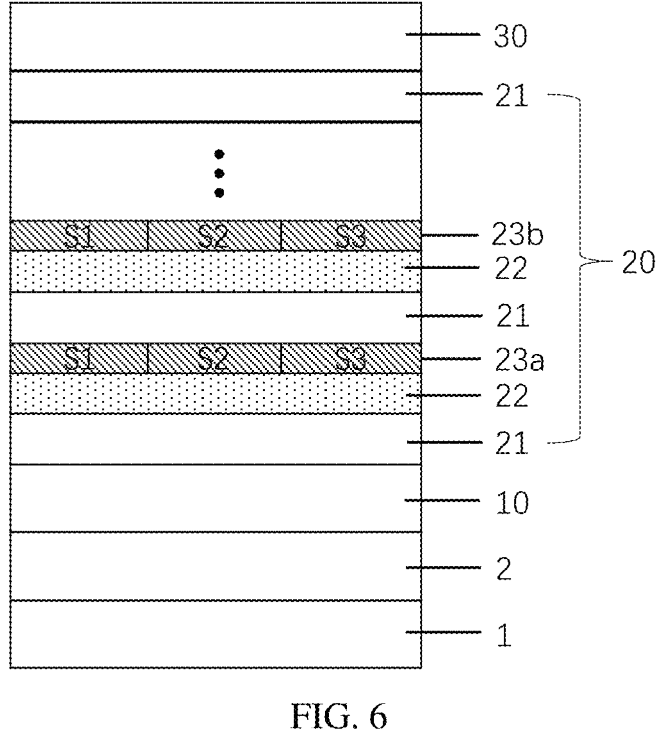
FIG. 6 is a schematic diagram of a semiconductor structure according to another embodiment of the present application.

FIG. 6 is a schematic diagram of a semiconductor structure according to another embodiment of the present application.

As shown in FIG. 6, a difference between a semiconductor structure of this embodiment and semiconductor structures described in above embodiments is that an insertion layer 23 has a plurality of sub-regions S1, . . . , Sm in a horizontal direction, and contents of the scandium component x in at least two sub-regions of the plurality of sub-regions are different. By adjusting the contents of the scandium component x in the horizontal direction of the insertion layer 23, a stress distribution of the entire multiple quantum well layer may be adjusted, thereby improving uniformity of light emission of the multiple quantum well layer and improving luminous efficiency of a light-emitting device.

In addition to the differences described above, other structures of the semiconductor structure in this embodiment may be referred to the corresponding structures of the semiconductor structure in embodiments described above.

The present application provides a semiconductor structure, including: a first semiconductor layer; a multiple quantum well layer formed by a plurality of quantum barrier layers and a plurality of quantum well layers alternately arranged; an insertion layer, disposed on each of the plurality of quantum well layers, where a material of the insertion layer is a nitride containing a scandium component; and a second semiconductor layer. The insertion layer above an InGaN quantum well layer of the multiple quantum well layer in the semiconductor structure of the present application is made of a nitride containing a scandium component, and a Sc atom is used to replace a Ga atom in a GaN insertion layer. Due to a larger cell size of Sc—N compared to Ga—N, a tensile stress of the insertion layer doped with Sc elements based on the InGaN quantum well layer may be alleviated and released, improving material quality of the insertion layer containing the Sc element, reducing defect density of the insertion layer, and providing the quantum well layer with a better protection, that is, avoiding precipitation of In from an InGaN quantum well while repairing deterioration of epitaxial quantum well materials. Moreover, the GaN insertion layer containing the scandium component may introduce a compressive stress to the InGaN quantum well layer located below, so that a band gap of the quantum well layer bends smaller due to stress, thereby realizing a longer light-emitting wavelength with the InGaN quantum well material with a lower component of In.

It should be understood that the terms "include" and variations thereof used in the present application are open ended, that is, "including but not limited to". The term "an embodiment" means "at least one embodiment"; the term "another embodiment" means "at least one further embodiment". In the specification, the schematic representation of the above terms does not necessarily refer to the same embodiment or example. Furthermore, the particular features, structures, materials, or characteristics described may be combined in any suitable manner in any one or more embodiments or examples. In addition, in the case of no contradiction, a person skilled in the art may combine different embodiments or examples described in the specification and features of different embodiments or examples.

The above embodiments only the preferred embodiments of the present application, and are not intended to limit the present application. Any modification, equivalent replacement, etc. made within the spirit and principles of the present application should be included in the scope of protection of the present application.

What is claimed is:

1. A semiconductor structure, comprising:

a first semiconductor layer;

a multiple quantum well layer formed on the first semiconductor layer, wherein the multiple quantum well layer comprises a plurality of quantum barrier layers and a plurality of quantum well layers alternately arranged;

an insertion layer formed on each of the plurality of quantum well layers; and a second semiconductor layer formed on the multiple quantum well layer;

wherein a material of the insertion layer is a nitride containing a scandium component;

the semiconductor structure comprises a plurality of insertion layers, and a thickness of each of the plurality of insertion layers is greater than or equal to 0.5 nm and less than or equal to 5 nm.

2. The semiconductor structure according to claim 1, wherein the material of the insertion layer comprises one or more combinations of $Sc_xGa_{1-x}N$, $Sc_xAl_yGa_{1-x-y}N$, $Sc_xIn_yGa_{1-x-y}N$, or $Sc_xAl_yIn_zGa_{1-x-y-z}N$.

3. The semiconductor structure according to claim 2, wherein a content of the scandium component x in the insertion layer is greater than or equal to 0.01 and less than or equal to 0.5.

4. The semiconductor structure according to claim 1, wherein the semiconductor structure comprises a plurality of insertion layers, and in a direction from the first semiconductor layer to the multiple quantum well layer, a content change of the scandium component of each of the plurality of insertion layers comprises one or more combinations of uniform invariance, linear increasing, linear decreasing, stepped increasing, stepped decreasing, and delta changing.

5. The semiconductor structure according to claim 1, wherein a doping type of the insertion layer is n-type doping or p-type doping.

6. The semiconductor structure according to claim 1, wherein the semiconductor structure comprises a plurality of insertion layers, and in a direction from the first semiconductor layer to the multiple quantum well layer, contents of the scandium component x in the plurality of insertion layers increase uniformly or jumps layer by layer.

7. The semiconductor structure according to claim 1, wherein in a direction from the first semiconductor layer to the multiple quantum well layer, the insertion layer is a multi-layer structure.

8. The semiconductor structure according to claim 7, wherein materials of the multi-layer structure are the same and comprise one of $Sc_xGa_{1-x}N$, $Sc_xAl_yGa_{1-x-y}N$, $Sc_xIn_yGa_{1-x-y}N$, or $Sc_xAl_yIn_zGa_{1-x-y-z}N$.

9. The semiconductor structure according to claim 7, wherein the multi-layer structure comprises a first scandium component layers and a second scandium component layer, away from the quantum well layer, stacked in layers.

10. The semiconductor structure according to claim 9, wherein a content of the scandium component x in the first scandium component layer is greater than a content of the scandium component x in the second scandium component layer.

11. The semiconductor structure according to claim 7, wherein materials of the multi-layer structure are different and comprise a combination of multiple sequential structures or periodic structures of $Sc_xGa_{1-x}N$, $Sc_xAl_yGa_{1-x-y}N$, $Sc_xIn_yGa_{1-x-y}N$, or $Sc_xAl_yIn_zGa_{1-x-y-z}N$.

12. The semiconductor structure according to claim 11, wherein a content of the scandium component x in the multi-layer structure is the same or different.

13. The semiconductor structure according to claim 1, wherein the insertion layer comprises a plurality of sub-regions in a horizontal direction.

14. The semiconductor structure according to claim 13, wherein contents of the scandium component x in at least two sub-regions of the plurality of sub-regions are different.

15. The semiconductor structure according to claim 1, wherein the quantum well layer is an InGaN quantum well layer, and the quantum barrier layer is a GaN quantum barrier layer.

16. The semiconductor structure according to claim 1, wherein the first semiconductor layer is an n-type layer, the second semiconductor layer is a p-type layer, and materials of the first semiconductor layer and the second semiconductor layer are GaN-based materials.

* * * * *